United States Patent
Dan et al.

(10) Patent No.: US 10,985,575 B2
(45) Date of Patent: Apr. 20, 2021

(54) THERMAL RUNAWAY DETECTION CIRCUIT AND METHOD

(71) Applicant: Contemporary Amperex Technology Co., Limited, Ningde (CN)

(72) Inventors: Zhimin Dan, Ningde (CN); Chao Zeng, Ningde (CN); Xiao Wang, Ningde (CN); Jia Xu, Ningde (CN); Yizhen Hou, Ningde (CN); Wei Zhang, Ningde (CN); Guoliang Hu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 112 days.

(21) Appl. No.: 16/555,006

(22) Filed: Aug. 29, 2019

(65) Prior Publication Data

US 2020/0350770 A1  Nov. 5, 2020

(30) Foreign Application Priority Data

Apr. 30, 2019 (CN) .......................... 201910363818.2

(51) Int. Cl.
*H02J 7/00* (2006.01)
*G01R 31/382* (2019.01)
(Continued)

(52) U.S. Cl.
CPC ........ *H02J 7/00041* (2020.01); *G01R 31/364* (2019.01); *G01R 31/382* (2019.01); *G01K 7/021* (2013.01)

(58) Field of Classification Search
CPC . H02J 7/00041; G01R 31/382; G01R 31/364; G01K 7/16; G01K 7/183; H01M 10/486
See application file for complete search history.

(56) References Cited

U.S. PATENT DOCUMENTS 10,050,315 B2 * 8/2018 Kim .................. H01M 10/4257
10,809,133 B2 * 10/2020 Durrer ................ H01M 10/425
(Continued)

FOREIGN PATENT DOCUMENTS

CN  101226670 A  7/2008
CN  201465255 U  5/2010
(Continued)

OTHER PUBLICATIONS

The second Office Action for Chinese Application No. 201910363818. 2, dated Oct. 16, 2020, 29 pages.
(Continued)

*Primary Examiner* — Richard V Muralidar
(74) *Attorney, Agent, or Firm* — Law Offices of Liaoteng Wang

(57) ABSTRACT

The present disclosure provides a thermal runaway detection circuit and a method, which is directed to field of batteries. The circuit includes: a sensing module including a terminating resistor; a detection module including a first voltage dividing resistor set and a second voltage dividing resistor set; and a processing module connected to the detection module, wherein the processing module is configured to obtain thermal runaway detection data, and determine whether thermal runaway occurs in the battery pack based on the thermal runaway detection data. The thermal runaway detection data includes first sampled data and second sampled data. The technical solutions in the present disclosure can improve safety of the battery pack.

14 Claims, 3 Drawing Sheets

(51) Int. Cl.
*G01R 31/364* (2019.01)
*G01K 7/02* (2021.01)

(56) References Cited

U.S. PATENT DOCUMENTS

| | | | | |
|---|---|---|---|---|
| 2016/0204481 A1* | 7/2016 | Ryu | .................... | H01M 10/486 |
| | | | | 429/7 |
| 2016/0336769 A1* | 11/2016 | Kim | ....................... | H02J 7/0026 |
| 2019/0393696 A1* | 12/2019 | Tada | ................... | H01H 37/5427 |
| 2020/0350536 A1* | 11/2020 | Hu | ........................ | H01M 50/30 |
| 2020/0350636 A1* | 11/2020 | Zhu | ....................... | G01R 31/392 |

FOREIGN PATENT DOCUMENTS

| | | |
|---|---|---|
| CN | 104215823 A | 12/2014 |
| CN | 105653380 A | 6/2016 |
| CN | 106114275 A | 11/2016 |
| CN | 106205029 A | 12/2016 |
| CN | 108181592 A | 6/2018 |
| CN | 108446434 A | 8/2018 |
| CN | 109142856 A | 1/2019 |
| CN | 109334514 A | 2/2019 |
| CN | 109364399 A | 2/2019 |
| CN | 109435692 A | 3/2019 |
| CN | 109494419 A | 3/2019 |
| CN | 208760433 U | 4/2019 |
| DE | 202017103776 U1 | 11/2017 |
| EP | 3401980 A1 | 11/2018 |
| JP | 2013024718 A | 2/2013 |
| WO | 2008014922 A1 | 2/2008 |

OTHER PUBLICATIONS

The extended European search report for European Application No. 19198158.8, dated Apr. 3, 2020, 10 pages.
PCT International Search Report for PCT/CN2020/081472, dated Jun. 17, 2020, 10 pages.
Yuguang Li, "Design of fire detection and control system for lithium iron phosphate battery", Chinese Journal of Power Sources, vol. 43 No. 3, dated Mar. 31, 2019, 3 pages.
The first Office Action and search report for Chinese Application No. 201910363818.2, dated Jul. 30, 2020, 15 pages.

* cited by examiner

THERMAL RUNAWAY DETECTION CIRCUIT AND METHOD

CROSS REFERENCE TO RELATED APPLICATION

The present application is based upon and claims the benefits of Chinese Patent Application No. 201910363818.2 filed on Apr. 30, 2019, the entire contents of which are incorporated herein by reference.

FIELD

The present disclosure generally relates to batteries, and more particularly to a thermal runaway detection circuit and method.

BACKGROUND

With the rapid development of new energy sources, new energy sources may provide power for more and more devices. For example, a battery pack may be used as power sources to power new energy vehicles, new energy ships, new energy aircraft, and so on. The battery pack may generate heat during operation. Under normal conditions, the heat generated by the battery pack is controllable. However, in an abnormal state, such as collision, overcharge, etc., the heat generated by the battery pack is uncontrollable, resulting in thermal runaway. In the event of thermal runaway, a fire may be caused, which may threaten safety of the battery pack, the devices in which the battery pack is installed, and personal safety of the person concerned.

In order to improve the safety of the battery pack, a battery management system (BMS) is currently used to monitor change of voltage or temperature to determine whether thermal runaway occurs. However, in the event of thermal runaway, a circuit board or a monitoring unit used to communicate with the BMS may be sputtered and burned by the high-temperature electrolyte generated from the thermal runaway. Therefore, the BMS cannot detect the thermal runaway and the safety of the battery pack is reduced.

SUMMARY

The present disclosure provides a thermal runaway detection circuit and method, which may improve safety of a battery pack.

In a first aspect, the present disclosure provides a thermal runaway detection circuit. The thermal runaway detection circuit may include: a sensing module including a terminating resistor, wherein the terminating resistor is connected to a temperature sensitive cable, and wherein a distance between at least a portion of the temperature sensitive cable and a cell of a battery pack is less than a temperature sensitive distance threshold; a detection module including a first voltage dividing resistor set and a second voltage dividing resistor set, wherein the first voltage dividing resistor set, the terminating resistor, and the second voltage dividing resistor set are connected in series via the temperature sensitive cable, and wherein one end of the first voltage dividing resistor set is connected to a first power supply terminal, and one end of the second voltage dividing resistor set is connected to ground; and a processing module connected to the detection module, wherein the processing module is configured to obtain thermal runaway detection data, and determine whether thermal runaway occurs in the battery pack based on the thermal runaway detection data, wherein the thermal runaway detection data includes first sampled data collected from a first sampling point and second sampled data collected from a second sampling point, the first sampling point is disposed between the other end of the first voltage dividing resistor set and the terminating resistor, and the second sampling point is disposed between the other end of the second voltage dividing resistor set and the terminating resistor.

In a second aspect, the present disclosure provides a method for thermal runaway detection applied in the thermal runaway detection circuit of the first aspect. The method may include: obtaining, by the processing module, thermal runaway detection data; and determining, by the processing module, whether thermal runaway occurs in the battery pack based on the thermal runaway detection data; wherein the thermal runaway detection data includes first sampled data collected from a first sampling point and second sampled data collected from a second sampling point, the first sampling point is disposed between the other end of the first voltage dividing resistor set and the terminating resistor, and the second sampling point is disposed between the other end of the second voltage dividing resistor set and the terminating resistor.

Embodiments of the present disclosure provide a thermal runaway detection circuit and method. The thermal runaway detection circuit includes a sensing module, a detection module, and a processing module. The terminating resistor in the sensing module is connected with the temperature sensitive cable, and the terminating resistor is connected in series with the first voltage dividing resistor set and the second voltage dividing resistor set through the temperature sensitive cable. The distance between at least a portion of the temperature sensitive cable and a cell in the battery pack is less than a temperature sensitive distance threshold, such that the temperature sensitive cable can be affected by the temperature of the cell in the battery pack. When the temperature sensitive cable is affected by the temperature of the cell, the on-off state of the temperature sensitive cable will change, so that the first sampled data and the second sampled data in the obtained thermal runaway detection data will change. The processing module may detect the thermal runaway in the battery pack in time based on the thermal runaway detection data. As a result, the safety of the battery pack is improved.

BRIEF DESCRIPTION OF THE DRAWINGS

The present disclosure will be better understood by reading the following detailed description with reference to the appended drawings, in which the same or similar numerals represent the same or similar features.

DETAILED DESCRIPTION

Features of various aspects and exemplary embodiments of the present disclosure will be described in detail below. In the following detailed description, many specific details are disclosed to provide a thorough understanding of the present disclosure. However, it is apparent to a person skilled in the art that the present disclosure may be practiced without some of these specific details. The following descriptions of embodiments are merely to provide a better understanding of the present disclosure through illustrating examples of the present disclosure. The present disclosure is by no means limited to any specific configuration and algorithm disclosed below, but rather covering any modification, substitution, and improvement of elements, components, and algorithms without departing from the spirit of the present disclosure. In the appended drawings and the following descriptions, well-known structures and techniques are not illustrated to avoid unnecessarily obscuring the present disclosure.

Embodiments of the present disclosure provide a thermal runaway detection circuit, method, and storage medium, which may be used in a scenario for monitoring a thermal runaway of a battery pack. The battery pack may include at least one cell. The battery pack may be a battery module, a battery package, or the like, which is not limited herein. In the embodiments of the disclosure, the thermal runaway detection circuit may detect the thermal runaway of the battery pack in time and facilitate corresponding measures in the subsequent process, so as to improve the safety of the battery pack.

Figure 1:
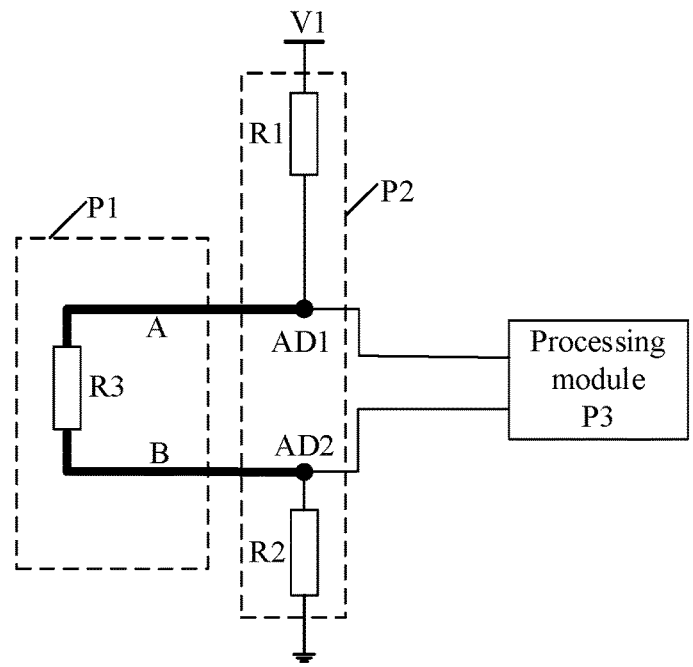
FIG. 1 is a schematic structure diagram of a thermal runaway detection circuit according to an embodiment of the present disclosure.

FIG. 1 is a schematic structure diagram of a thermal runaway detection circuit according to an embodiment of the present disclosure. As shown, the thermal runaway detection circuit may include a sensing module P1, a detection module P2, and a processing module P3.

The sensing module P1 may include a terminating resistor. The terminating resistor may be connected to a temperature sensitive cable. The distance between at least a portion of the temperature sensitive cable and a cell of the battery pack is less than a temperature sensitive distance threshold.

Two wires (e.g. steel wires) may be included within the temperature sensitive cable. Each of the two wires may be wrapped with heat-sensitive material. The two wires are in a twisted-pair structure. For example, as shown in FIG. 1, for ease of understanding, the temperature sensitive cable is represented by two separate wires A and B. In an actual scenario, the two wires A and B are located in the same temperature sensitive cable. Under normal circumstances, the two wires in the temperature sensitive cable do not contact with each other directly. When the temperature of a part of the temperature sensitive cable rises rapidly and exceeds beyond a high-temperature threshold, the heat-sensitive material wrapped around the two wires may melt with each other, so that the two wires within the temperature sensitive cable are twisted and connected together due to the torsion force, so that a short circuit is caused in the temperature sensitive cable. The high-temperature threshold may be set according to specific operation scenarios and operation requirements, and is not limited herein. For example, the high-temperature threshold may be 85° C., 105° C. or 125° C., and the like.

The temperature sensitive distance threshold is a distance threshold with which the temperature sensitive cable is able to sensitively sense that the temperature of a cell in the battery pack is above the temperature threshold. When the distance between the temperature sensitive cable and the cell in the battery pack is less than the temperature sensitive distance threshold, the error between the temperature corresponding to the on-off state of the temperature sensitive cable being caused to change and the actual temperature of the cell in the battery pack is within an acceptable range. The temperature sensitive distance threshold may be set based on a characteristic parameter of the temperature sensitive cable and a characteristic parameter of the cell in combination with specific operation scenarios and operation requirements, which is not limited herein.

In some examples, in order to be able to detect thermal runaway of the battery pack more timely, at least a portion of the temperature sensitive cable may be disposed right above a cell explosion-proof valve port of the cell of the battery pack. When thermal runaway occurs in the battery pack, the cell explosion-proof valve port will rupture, and high-temperature electrolyte, high-temperature gas, etc. will be ejected from the explosion-proof valve port of the cell. At least a portion of the temperature sensitive cable being disposed right above the cell explosion-proof valve port of the cell of the battery pack may make the temperature sensitive cable more sensitive to thermal runaway sensing of the battery pack. As a result, accuracy and timeliness in thermal runaway detection may be further improved.

The detection module P2 may include a first voltage dividing resistor set and a second voltage dividing resistor set. One end of the first voltage dividing resistor set is connected to a first power supply terminal, and one end of the second voltage dividing resistor set is connected to ground. The first voltage dividing resistor set, the terminating resistor, and the second voltage dividing resistor set are connected in series via the temperature sensitive cable. In particular, one wire of the temperature sensitive cable connected to the terminating resistor is connected to the other end of the first voltage dividing resistor set, and the other wire of the temperature sensitive cable is connected to the other end of the second voltage-dividing resistor set.

The first voltage dividing resistor set may include at least one resistor. If the first voltage dividing resistor set includes a plurality of resistors, the number of resistors and the connection relationship therebetween are not limited herein. The second voltage dividing resistor set may include at least one resistor. If the first voltage dividing resistor set includes a plurality of resistors, the number of resistors and the connection relationship therebetween are not limited herein. The specific structure of the first voltage dividing resistor set and the second voltage dividing resistor set may be set according to specific operation scenarios and operation requirements, which is not limited herein.

For example, as shown in FIG. 1, the first voltage dividing resistor set may include a resistor R1, the second voltage dividing resistor set may include a resistor R2, and the terminating resistor is a resistor R3. The resistor R1, the resistor R3, and the resistor R2 are connected in series. The resistor R1 and the resistor R3 are connected through the wire A within the temperature sensitive cable. The resistor R2 and the resistor R3 are connected through the wire B within the temperature sensitive cable.

In some examples, the detection module P2 may be specifically disposed in a Battery Management Unit (BMU). The BMU may include a housing structure for protection. The detection module P2 may be protected from the high-temperature electrolyte generated from thermal runaway of the battery pack. Alternatively, the position of the detection module P2 is not specifically limited, and the detection module P2 may be provided with a protective cover to protect the detection module P2 from the high-temperature electrolyte generated from thermal runaway of the battery pack, so as to further ensure the timeliness of the detection of the thermal runaway and the safety of the thermal runaway detection circuit.

The processing module P3 may be connected to the detection module P2. The processing module P3 may be configured to obtain thermal runaway detection data, and determine whether thermal runaway occurs in the battery pack based on the thermal runaway detection data.

The thermal runaway detection data may include first sampled data collected from a first sampling point and second sampled data collected from a second sampling point. The first sampling point may be disposed between the other end of the first voltage dividing resistor set and the terminating resistor. The second sampling point may be disposed between the other end of the second voltage dividing resistor set and the terminating resistor. As shown in FIG. 1, the first sampling point is labeled as AD1 and the second sampling point is labeled as AD2. Specifically, sampling ports can be separately set at each of the first sampling point and the second sampling point.

In some examples, the processing module P3 may be a micro control unit (MCU) in the BMU, or the processing module P3 may also be independently set, which is not limited herein.

The first sampled data and the second sampled data may specifically be electrical signal parameter data, such as a voltage value, a current value, and the like, which is not limited herein.

According to the first sampled data and the second sampled data, the on-off state of the temperature sensitive cable may be determined, that is, the cable sense line is short-circuited, open-circuited, or in normal-path state.

In some examples, whether there is the thermal runaway in the battery pack can be directly determined based on the on-off state of the temperature sensitive cable. In order to further improve the detection accuracy of thermal runaway, other thermal runaway detection data may be combined together to determine whether there is the thermal runaway in the battery pack in addition to the first sampled data and the second sampled data.

In an embodiment of the present disclosure, the thermal runaway detection circuit may include the sensing module P1, the detection module P2, and the processing module P3. The terminating resistor in the sensing module P1 is connected with the temperature sensitive cable, and the terminating resistor is connected in series with the first voltage dividing resistor set and the second voltage dividing resistor set through the temperature sensitive cable. The distance between at least a portion of the temperature sensitive cable and the cell in the battery pack is less than the temperature sensitive distance threshold, such that the temperature sensitive cable can be affected by the temperature of the cell in the battery pack. When the temperature sensitive cable is affected by the temperature of the cell, the on-off state of the temperature sensitive cable will change, so that the first sampled data and the second sampled data of the thermal runaway detection data obtained from the detection module P2 will change. The processing module P3 may detect the thermal runaway in the battery pack in time based on the thermal runaway detection data. As a result, the safety of the battery pack can be improved.

In some examples, the state of the BMU may include an operating state and a sleep state. When the BMU is in the operating state, a power module of the BMU may supply power to the BMU to enable the BMU to perform normal data monitoring on the battery pack, such as voltage monitoring, current monitoring, temperature monitoring, insulation monitoring, and state of charge monitoring, etc., so as to obtain voltage, current, temperature, state of charge, etc. as the thermal runaway detection data. When the BMU is in the sleep state, the power module of the BMU may stop supplying power to the BMU, and the BMU may stop monitoring data of the battery pack.

If thermal runaway occurs in the battery pack when the BMU is in the sleep state, the BMU stops monitoring the data of the battery pack and cannot provide thermal runaway detection data. If the function of the processing module P3 is integrated in the BMU, when the BMU is in the sleep state, the detection of the thermal runaway cannot be performed.

Figure 2:
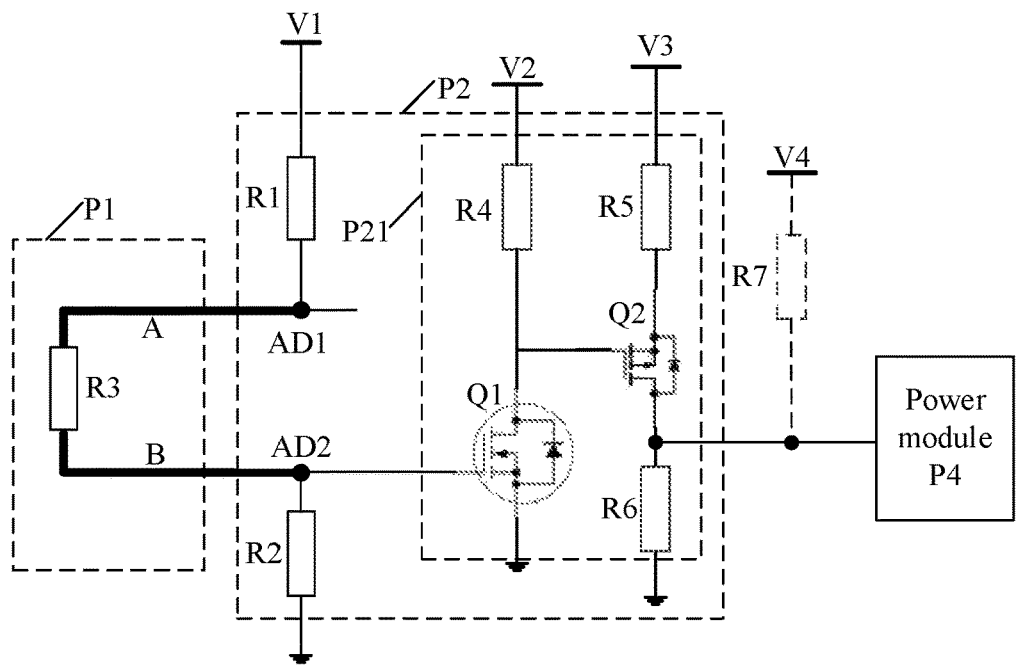
FIG. 2 is a schematic structure diagram of a thermal runaway detection circuit according to another embodiment of the present disclosure.

In order to perform thermal runaway detection and obtain the thermal runaway detection data during the thermal runaway detection when the BMU is in the sleep state, the detection module P2 in the above embodiments may further include a sleep-wakeup submodule P21. FIG. 2 is a schematic structure diagram of a thermal runaway detecting circuit according to another embodiment of the present disclosure (the processing module P3 is not shown). As shown in FIG. 2, the detection module P2 may further include the sleep wakeup submodule P21.

The sleep-wakeup submodule P21 may be connected to the other end of the second voltage dividing resistor set. The sleep-wakeup submodule P21 may be configured to receive a driving signal transmitted by the sensing module P1, and transmit a wakeup signal to a power module P4 of the battery management unit if the driving signal indicates that the sleep-wakeup submodule P21 is turned on. Specifically, if the temperature sensitive cable connected to the terminating resistor of the sensing module P1 is in the normal-path state or open circuited, the driving signal transmitted from the temperature sensitive cable may control the sleep-wakeup submodule P21 to be turned off, with the BMU still in the sleep state. If the temperature sensitive cable connected to the terminating resistor of the sensing module P1 is short circuited, the driving signal transmitted from the temperature sensitive cable may control the sleep-wakeup submodule P21 to be turned on and send a wakeup signal to the power module of the BMU. The power module of the BMU may receive the wakeup signal, and the BMU may switch from the sleep state to the operating state.

In some examples, the sleep-wakeup submodule P21 may include a first resistor set, a first switch tube, a second resistor set, a second switch tube, and a third resistor set. The first resistor set may include at least one resistor. If the first resistor set includes a plurality of resistors, the number of resistors and the connection relationship therebetween are not limited herein. The second resistor set and the third resistor set are the same as the first resistor set, and are not described herein again. The first switch tube and the second switch tube may be metal oxide semiconductor (MOS) tubes or other switch tubes, which is not limited herein.

One end of the first resistor set may be connected to a second power supply terminal, and the other end of the first resistor set may be connected to both of a first terminal of the first switch tube and a control terminal of the second switch tube. A control terminal of the first switch tube may be connected to the other end of the second voltage dividing resistor set, and a second terminal of the first switch tube may be connected to the ground. One end of the second resistor set may be connected to a third power supply terminal, and the other end of the second resistor set may be connected to a first terminal of the second switch tube. A second terminal of the second switch tube may be connected to both of one end of a third resistor set and the power module of the battery management unit. The other end of the third resistor set may be connected to the ground. The power module can be implemented as a power chip, such as a System Basis Chip (SBC), which is not limited herein. The voltages provided by the first power supply terminal, the second power supply terminal, and the third power supply terminal may be the same or different, which is not limited herein. For example, the first power supply terminal, the second power supply terminal, and the third power supply terminal may provide a voltage of 5V. If the battery pack and the thermal runaway detection circuit are installed in a car, the voltage of 5V at the first power supply terminal, the second power supply terminal, and the third power supply terminal may be supplied by a lead-acid battery in the car.

For example, as shown in FIG. 2, the first resistor set may include a resistor R4, the second resistor set may include a resistor R5, and the third resistor set may include a resistor R6. The first switch tube may be an N-channel Metal Oxide Semiconductor (MOS) transistor Q1. The control terminal of the first switch tube Q1 may be a gate electrode, the first terminal may be a drain electrode, and the second terminal may be a source electrode. The second switch tube may be a P-channel MOS transistor Q2. The control terminal of the second switch tube Q2 may be a gate electrode, the first terminal may be a source electrode, and the second terminal may be a drain electrode.

For example, the BMU is in the sleep state. Thermal runaway occurs in the battery pack, and the temperature sensitive cable is short circuited due to melting. The electric potential of the control terminal of the first switch tube is pulled high, and the first switch tube is turned on. The electric potential of the control terminal of the second switch tube is pulled down to a break-over voltage drop of the first switch tube, and the second switch tube is turned on. The wakeup signal may be sent to the power module P4 of the BMU through a wakeup signal line between the second terminal of the second switch tube and the power module P4 to wake up the BMU.

It should be noted that if the BMU is in the operating state, a fourth power supply terminal may be disposed to continuously provide a wakeup signal to the power module P4 of the BMU. The fourth power supply terminal is powered on when the BMU is in operating state, so as to ensure continuous provision of the wakeup signal to the BMU. The fourth power supply terminal is powered off when the BMU is in the sleep state, and then the BMU may be waked up by the sleep-wakeup submodule P21. As shown in FIG. 2, a resistor R7 may be disposed between the fourth power supply terminal V4 and the BMU. The value of the voltage provided by the fourth power supply terminal may be the same as the value of the voltage provided by the first power supply terminal, or may be different, which is not limited herein. For example, the voltage supplied by the fourth power supply terminal may be 12V.

Figure 3:
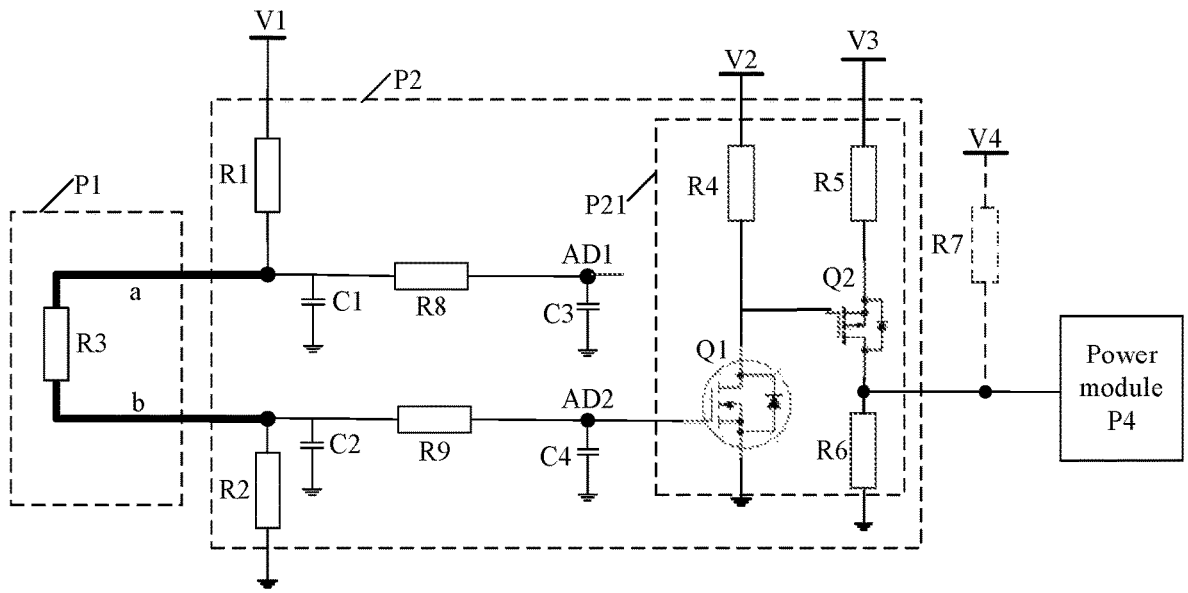
FIG. 3 is a schematic structure diagram of a thermal runaway detection circuit according to yet another embodiment of the present disclosure.

FIG. 3 is a schematic structure diagram of a thermal runaway detection circuit according to yet another embodiment of the present disclosure (the processing module P3 is not shown). FIG. 3 differs from FIG. 2 in that the thermal runaway detection circuit shown in FIG. 3 further includes some protection devices and/or filter devices.

The thermal runaway detection circuit may also include a first protection capacitor and/or a second protection capacitor. The thermal runaway detection circuit may further include a first filter capacitor and a first filter resistor, and/or a second filter capacitor and a second filter resistor. For ease of explanation, as shown in FIG. 3, the thermal runaway detection circuit includes a first protection capacitor C1, a second protection capacitor C2, a first filter capacitor C3, a second filter capacitor C4, a first filter resistor R8, and a second filter resistor. R9, for example.

One end of the first protection capacitor may be connected to the other end of the first voltage dividing resistor set, and the other end of the first protection capacitor may be connected to the ground. One end of the second protection capacitor may be connected to the other end of the second voltage dividing resistor set, and the other end of the second protection capacitor may be connected to the ground. The first protection capacitor and the second protection capacitor may prevent the occurrence of Electro Static Discharge (ESD) in the thermal runaway detection circuit.

For example, as shown in FIG. 3, one end of the first protection capacitor C1 may be connected to the other end of the resistor R1, and the other end of the first protection capacitor C1 may be connected to the ground. One end of the second protection capacitor C2 may be connected to the other end of the resistor R2, and the other end of the second protection capacitor C2 may be connected to the ground.

One end of the first filter capacitor may be connected to the first sampling point, and the other end of the first filter capacitor may be connected to the ground. One end of the second filter capacitor may be connected to the second sampling point, and the other end of the second filter capacitor may be connected to the ground. One end of the first filter resistor may be connected to the other end of the first voltage dividing resistor set, and the other end of the first filter resistor may be connected to the first sampling point. One end of the second filter resistor may be connected to the other end of the second voltage dividing resistor set, and the other end of the second filter resistor may be connected to the second sampling point. The first filter capacitor and the first filter resistor may form an RC filter circuit to filter the first sampled data, and the second filter capacitor and the second filter resistor may form an RC filter circuit to filter the second sampled data, so as to improve accuracy of the first sampled data and the second sampled data. As a result, the accuracy of the thermal runaway detection.

For example, as shown in FIG. 3, one end of the first filter capacitor C3 may be connected to the first sampling point AD1, and the other end of the first filter capacitor C3 may be connected to the ground. One end of the second filter capacitor C4 may be connected to the second sampling point AD2, and the other end of the second filter capacitor C4 may be connected to the ground. One end of the first filter resistor R8 may be connected to the other end of the resistor R1, and the other end of the first filter resistor R8 may be connected to the first sampling point AD1. One end of the second filter resistor R9 may be connected to the other end of the resistor R2, and the other end of the second filter resistor R9 may be connected to the second sampling point AD2.

In some examples, the processing module P3 may be further configured to send an alarm signal to a vehicle controller to notify relevant personnel to take corresponding measures in time, when it is determined that thermal runaway occurs in the battery pack.

In an embodiment of the present disclosure, the processing module P3 may be configured to determine the on-off state of the temperature sensitive cable based on the first sampled data and the second sampled data. The on-off state may include a short-circuit state, an open-circuit state, or a normal-path state.

For ease of explanation, the thermal runaway detection will be described below using voltage values as the first sampled data and the second sampled data.

In some examples, the processing module P3 may be configured to determine that the temperature sensitive cable is short circuited if the first sampled data is equal to the second sampled data; and determine that thermal runaway occurs in the battery pack if the temperature sensitive cable is short circuited.

As shown in FIG. 1 to FIG. 3, if the voltage value at the first sampling point is equal to the voltage value at the second sampling point, it can be determined that the temperature sensitive cable is short circuited. Due to the harsh conditions of short-circuiting of the temperature sensitive cable, the temperature sensitive cable generally is not short circuited in the case of non-thermal-runaway. Therefore, if the temperature sensitive cable is short circuited, it can be determined that thermal runaway occurs in the battery pack.

In some examples, the thermal runaway detection data described above may also include battery pack parameters.

The processing module P3 may be configured to: determine that the temperature sensitive cable is open circuited if the first sampled data is the same as the value of the voltage provided by the first power supply terminal and the second sampled data is zero; and determine that thermal runaway occurs in the battery pack if it is determined that the temperature sensitive cable is open circuited within a preset period and at least one of the battery pack parameters satisfies a fault condition.

For example, the voltage supplied by the first power supply terminal is 5V. If the voltage value collected from the first sampling point is 5V, and the voltage value collected from the second sampling point is 0V, it can be determined that the temperature sensitive cable is open circuited.

The preset period may be set according to the specific operation scenes and operation requirements, which is not limited herein. Setting of the preset period can effectively avoid at least a part misjudgment for the thermal runaway and improve the reliability of the thermal runaway detection.

The battery pack parameters may include one or more of the following parameters: a maximum temperature of a cell in the battery pack, a temperature change rate of a cell in the battery pack, a difference between the maximum temperature and a minimum temperature of a cell in the battery pack, a minimum voltage of a cell in the battery pack, a number of voltage sampling open-circuit faults of the battery pack, a temperature sensing failure parameter, and a cell monitoring communication failure parameter.

The number of voltage sampling open-circuit faults of the battery pack may indicate the number of open-circuit faults in voltage sampling performed on each of cells of the battery pack.

The temperature sensing failure parameter may characterize whether the sensor or sensing component used for temperature sensing fails. For example, a negative temperature coefficient (NTC) thermistor may be provided in the battery pack, and the temperature sensing failure parameter may indicate whether the NTC thermistor disposed in the battery pack fails completely.

The cell monitoring communication failure parameter may characterize whether a communication between the component that monitors the cell and the BMU fails (i.e., whether the communication is lost). For example, the cell of the battery pack may be equipped with a Cell Supervision Circuit (CSC), and the cell monitoring communication failure parameter may indicate whether the communication between the CSC and the BMU fails.

The fault condition may include a parameter exceeding the safety parameter threshold range or a parameter characterizing a failure.

Each parameter of the battery pack parameters may be associated with a different safety parameter threshold range from each other. The safety parameter threshold range corresponding to the maximum temperature of a cell in the battery pack may specifically be a maximum temperature safety threshold range. The safety parameter threshold range corresponding to the temperature change rate of a cell in the battery pack may specifically be a temperature change rate safety threshold range. The safety parameter threshold range corresponding to the difference between the maximum temperature and the minimum temperature of a cell in the battery pack may specifically be a temperature difference safety threshold range. The safety parameter threshold range corresponding to the minimum voltage of a cell in the battery pack may specifically be a minimum voltage safety threshold range. The safety parameter threshold range corresponding to the number of voltage sampling open-circuit faults of the battery pack may specifically be a fault data safety threshold range.

It should be noted that the fault condition may be set according to a specific operation scenario and operation requirements, which is not limited herein.

For example, following seven examples of determination of the thermal runaway of the battery pack are provided in the case of determining that the temperature sensitive cable is open circuited. However, it should be noted that the determination of the thermal runaway of the battery pack may include, but is not limited to, the following examples.

Example 1: if it is determined that the temperature sensitive cable is open circuited within 10 minutes, and the maximum temperature of a cell in the battery pack is greater than 68.4° C. for 2 seconds, it can be determined that thermal runaway occurs in the battery pack.

Example 2: if it is determined that the temperature sensitive cable is open circuited within 10 minutes, and the temperature change rate of a cell in the battery pack is greater than 3° C./second for 2 seconds, it can be determined that thermal runaway occurs in the battery pack.

Example 3: if it is determined that the temperature sensitive cable is open circuited within 10 minutes, and the difference between the maximum temperature and the minimum temperature of a cell in the battery pack is greater than 30° C., it can be determined that thermal runaway occurs in the battery pack.

Example 4: if it is determined that the temperature sensitive cable is open circuited within 10 minutes, and the minimum voltage of a cell in the battery is less than 2V for 300 milliseconds, it can be determined that thermal runaway occurs in the battery pack.

Example 5: if it is determined that the temperature sensitive cable is open circuited within 10 minutes, and the number of voltage sampling open-circuit faults of the battery pack is greater than or equal to 1, it can be determined that thermal runaway occurs in the battery pack.

Example 6: if it is determined that the temperature sensitive cable is open circuited within 10 minutes, and the temperature sensing failure parameter may indicate that the NTC thermistor disposed in the battery pack fails completely, it can be determined that thermal runaway occurs in the battery pack.

Example 7: if it is determined that the temperature sensitive cable is open circuited within 10 minutes, and the cell monitoring communication failure parameter may characterize that the communication between the CSC and the BMU fails, it can be determined that thermal runaway occurs in the battery pack.

In some examples, the first sampled data and the second sampled data are voltages specifically. Correspondingly, the first normal data threshold range is a first normal voltage threshold range, and the second normal data threshold range is a second normal voltage threshold range, specifically. The processing module P3 may be configured to: determine that the temperature sensitive cable is in the normal-path state, when the first sampled data is within a first normal data threshold range and the second sampled data is within a second normal data threshold range; and determine that thermal runaway occurs in the battery pack, when the temperature sensitive cable is in the normal-path state and at least a set of parameters of the battery pack parameters meets a fault condition. In this example, other thermal runaway detection data is needed to assist in determining if thermal runaway occurs in the battery pack to improve the reliability of the thermal runaway detection.

The set of parameters may include at least two parameters. The fault condition may include a parameter exceeding the safety parameter threshold range or a parameter characterizing a failure.

The first normal voltage threshold range and the second normal voltage threshold range may be determined based on the voltage provided by the first power supply terminal, the resistance value of the first voltage dividing resistor set, the resistance value of the terminating resistor, the resistance value of the second voltage dividing resistor set, and an acceptable error fluctuation range.

The above set of parameters may include any of the following sets of parameters: the minimum voltage of a cell in the battery pack, and the maximum temperature of a cell in the battery pack; the minimum voltage of a cell in the battery pack, and the temperature change rate of a cell in the battery pack; the minimum voltage of a cell in the battery pack, and the difference between the maximum temperature of a cell in the battery pack and the minimum temperature of a cell in the battery pack; the temperature change rate of a cell in the battery pack, and the maximum temperature of a cell in the battery pack; the temperature change rate of a cell in the battery pack, and the difference between the maximum temperature of a cell in the battery pack and the minimum temperature of a cell in the battery pack; the number of voltage sampling open-circuit faults of the battery pack, and the maximum temperature of a cell in the battery pack; the number of voltage sampling open-circuit faults of the battery pack, and the temperature change rate of a cell in the battery pack; the number of voltage sampling open-circuit faults of the battery pack, and the difference between the maximum temperature of a cell in the battery pack and the minimum temperature of a cell in the battery pack; and the number of voltage sampling open-circuit faults of the battery pack, and the temperature sensing failure parameter.

It should be noted that the fault conditions may be set according to specific operation scenarios and operation requirements, which is not limited herein.

For example, as an example, a plurality of parameters and their corresponding fault conditions are listed below. If at least one set of parameters meets its corresponding fault condition, it can be determined that thermal runaway occurs in the battery pack. At least one set of parameters satisfying its corresponding fault condition may further improve the reliability of the thermal runaway detection. It should be noted that the parameters and fault conditions in the embodiments of the present disclosure may include, but be not limited to, the following parameters.

The first set of parameters and corresponding fault conditions: the minimum voltage of a cell in the battery pack is less than 2V for 300 milliseconds, and the maximum temperature of a cell in the battery pack is greater than 68° C. for 2 seconds.

The second set of parameters and corresponding fault conditions: the minimum voltage of a cell in the battery pack is less than 2V for 300 milliseconds, and the temperature change rate of a cell in the battery pack is greater than 3° C./second for 2 seconds.

The third set of parameters and corresponding fault conditions: the minimum voltage of a cell in the battery pack is less than 2V for 300 milliseconds, and the difference between the maximum temperature and the minimum temperature of a cell in the battery pack is greater than 30° C.

The fourth set of parameters and corresponding fault conditions: the temperature change rate of a cell in the battery pack is greater than 3° C./second for 2 seconds, and the maximum temperature of a cell in the battery pack is greater than 68° C. for 2 seconds.

The fifth set of parameters and corresponding fault conditions: the temperature change rate of a cell in the battery pack is greater than 3° C./second for 2 seconds, and the difference between the maximum temperature and the minimum temperature of a cell in the battery pack is greater than 30° C.

The sixth set of parameters and corresponding fault conditions: the number of voltage sampling open-circuit faults of the battery pack is greater than or equal to 1, and the maximum temperature of a cell in the battery pack is greater than 68° C. for 2 seconds.

The seventh set of parameters and corresponding fault conditions: the number of voltage sampling open-circuit faults of the battery pack is greater than or equal to 1, and the temperature change rate of a cell in the battery pack is greater than 3° C./second for 2 seconds.

The eighth set of parameters and corresponding fault conditions: the number of voltage sampling open-circuit faults of the battery pack is greater than or equal to 1, and the difference between the maximum temperature and the minimum temperature of a cell in the battery pack is greater than 30° C.

The ninth set of parameters and corresponding fault conditions: the number of voltage sampling open-circuit faults of the battery pack is greater than or equal to 1, and the temperature sensing failure parameter characterizes that the NTC thermistor disposed in the battery pack completely fails.

If at least one set of the above nine sets of parameters satisfies corresponding fault conditions, it may be determined that thermal runaway occurs in the battery pack.

In some examples, the thermal runaway detection data may also include battery pack parameters. The battery pack parameters may include a maximum voltage of a cell in the battery pack during charging, an actual state of charge of the battery pack during charging, and a charging current of the battery pack during charging. The fault conditions may include a parameter exceeding the safety parameter threshold range.

The processing module P3 may be further configured to: determine that the temperature sensitive cable is in a normal-path state, when the first sampled data is within the first normal data threshold range and the second sampled data is within the second normal data threshold range; and send a thermal runaway warning message, when the temperature sensitive cable is in the normal-path state and the battery pack parameters satisfy the fault condition.

That is to say, if the temperature sensitive cable is determined to be in the normal-path state, the maximum voltage of a cell in the battery pack during charging exceeds a voltage safety parameter threshold range, the actual state of charge of the battery pack during charging exceeds a state of charge safety parameter threshold range, and the charging current of the battery pack during charging exceeds a current safety parameter threshold range, it may be predicted that thermal runaway is about to occur in the battery pack. The thermal runaway warning message may be sent, so that corresponding measures can be taken in advance to avoid thermal runaway and further improve the safety of the battery pack.

For example, during the charging, if the maximum voltage of a cell in the battery pack is greater than 1.1 times the tertiary overvoltage threshold, the actual state of charge of the battery pack is greater than 115%, and the charging current is greater than or equal to 0.33 times the rated charge current under one-hour-rate, it may be predicted that thermal runaway is about to occur in the battery pack. Then the thermal runaway warning message may be sent.

It is worth mentioning that if the first sampled data exceeds the first normal voltage threshold range, the second sampled data exceeds the second normal voltage threshold range, the first sampled data is not equal to the second sampled data, the first sampled data is different from the value of the voltage supplied by the first power supply terminal, and the second sampled data is not zero, it may be determined that there is a fault at the first sampling point and the second sampling point. The processing module P3 may send a prompt message about thermal runaway detection fault.

Figure 4:
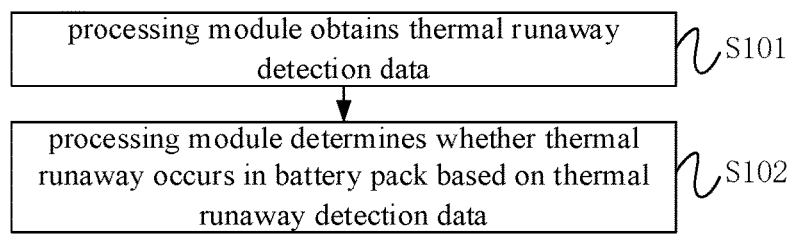
FIG. 4 is a flowchart of a method for thermal runaway detection according to an embodiment of the present disclosure.

Corresponding to the thermal runaway detection circuit in the above embodiments, FIG. 4 is a flowchart of a method for thermal runaway detection according to an embodiment of the present disclosure. As shown in FIG. 4, the method for thermal runaway detection may include steps S101 to S102.

In step S101, the processing module may obtain thermal runaway detection data.

The thermal runaway detection data may include first sampled data collected from the first sampling point and second sampled data obtained from the second sampling point. As shown in the thermal runaway detection circuit in the above embodiments, the first sampling point is disposed between the other end of the first voltage dividing resistor set and the terminating resistor. The second sampling point is disposed between the other end of the second voltage dividing resistor set and the terminating resistor.

In step S102, the processing module may determine whether thermal runaway occurs in the battery pack based on the thermal runaway detection data.

In the embodiments of the present disclosure, the thermal runaway detection circuit may include a sensing module, a detection module, and a processing module. The terminating resistor in the sensing module is connected with the temperature sensitive cable, and the terminating resistor is connected in series with the first voltage dividing resistor set and the second voltage dividing resistor set through the temperature sensitive cable. The distance between at least a portion of the temperature sensitive cable and the cell in the battery pack is less than the temperature sensitive distance threshold, such that the temperature sensitive cable can be affected by the temperature of the cell in the battery pack.

When the temperature sensitive cable is affected by the temperature of the cell, the on-off state of the temperature sensitive cable will change, so that the first sampled data and the second sampled data of the obtained thermal runaway detection data will change. The processing module may determine whether thermal runaway occurs in the battery pack based on the thermal runaway detection data so as to detect the thermal runaway of the battery pack in time. As a result, the safety of the battery pack can be improved.

In some examples, the step S102 may be refined as follows: the processing module may determine an on-off state of the temperature sensitive cable based on the first sampled data and the second sampled data, the on-off state comprising a short-circuit state, an open-circuit state, or a normal-path state; and the processing module may determine whether thermal runaway occurs in the battery pack based on the on-off state of the temperature sensitive cable.

In some examples, the first sampled data and the second sampled data are voltage values. The above step S102 may be refined as follows: the processing module may determine that the temperature sensitive cable is short circuited when the first sampled data is equal to the second sampled data; and the processing module may determine that thermal runaway occurs in the battery pack when the temperature sensitive cable is short circuited.

In some examples, the thermal runaway detection data may also include battery pack parameters. The battery pack parameters may include one or more of: the maximum temperature of a cell in the battery pack, the temperature change rate of a cell in the battery pack, the difference between the maximum temperature and the minimum temperature of a cell in the battery pack, the minimum voltage of a cell in the battery pack, the number of voltage sampling open-circuit faults of the battery pack, the temperature sensing failure parameter, and the cell monitoring communication failure parameter, The fault condition may include a parameter exceeding a safety parameter threshold range or a parameter characterizing a failure The above step S102 may be refined as follows: the processing module may determine that the temperature sensitive cable is open circuited, when the first sampled data is the same as data provided by the first power supply terminal and the second sampled data is the same as data provided by the ground; and the processing module may determine that thermal runaway occurs in the battery pack, when it is determined that the temperature sensitive cable is open circuited within a preset period and at least one of the battery pack parameters satisfies a fault condition.

In some examples, the thermal runaway detection data may also include battery pack parameters.

The above step S102 may be refined as follows: the processing module may determine that the temperature sensitive cable is in a normal-path state, when the first sampled data is within a first normal data threshold range and the second sampled data is within a second normal data threshold range; and the processing module may determine that thermal runaway occurs in the battery pack, when the temperature sensitive cable is in the normal-path state and at least a set of parameters of the battery pack parameters meets a fault condition.

The set of parameters may include at least two parameters. The set of parameters may include any of the following sets of parameters: the minimum voltage of a cell in the battery pack, and the maximum temperature of a cell in the battery pack; the minimum voltage of a cell in the battery pack, and the temperature change rate of a cell in the battery pack; the minimum voltage of a cell in the battery pack, and the difference between the maximum temperature of a cell in the battery pack and the minimum temperature of a cell in the battery pack; the temperature change rate of a cell in the battery pack, and the maximum temperature of a cell in the battery pack; the temperature change rate of a cell in the battery pack, and the difference between the maximum temperature of a cell in the battery pack and the minimum temperature of a cell in the battery pack; the number of voltage sampling open-circuit faults of the battery pack, and the maximum temperature of a cell in the battery pack; the number of voltage sampling open-circuit faults of the battery pack, and the temperature change rate of a cell in the battery pack; the number of voltage sampling open-circuit faults of the battery pack, and the difference between the maximum temperature of a cell in the battery pack and the minimum temperature of a cell in the battery pack; and the number of voltage sampling open-circuit faults of the battery pack, and the temperature sensing failure parameter.

The fault condition may include a parameter exceeding the safety parameter threshold range or a parameter characterizing a failure.

In some examples, the thermal runaway detection data further includes battery pack parameters including the maximum voltage of a cell in the battery pack during charging, the actual state of charge of the battery pack during charging, and the charging current of the battery pack during charging. The fault conditions may include a parameter exceeding a safety parameter threshold range The above method for thermal runaway detection may further include: determining that the temperature sensitive cable is in a normal-path state, when the first sampled data is within a first normal data threshold range and the second sampled data is within a second normal data threshold range; and sending a thermal runaway warning message, when the temperature sensitive cable is in the normal-path state and the battery pack parameters satisfy the fault condition.

Figure 5:
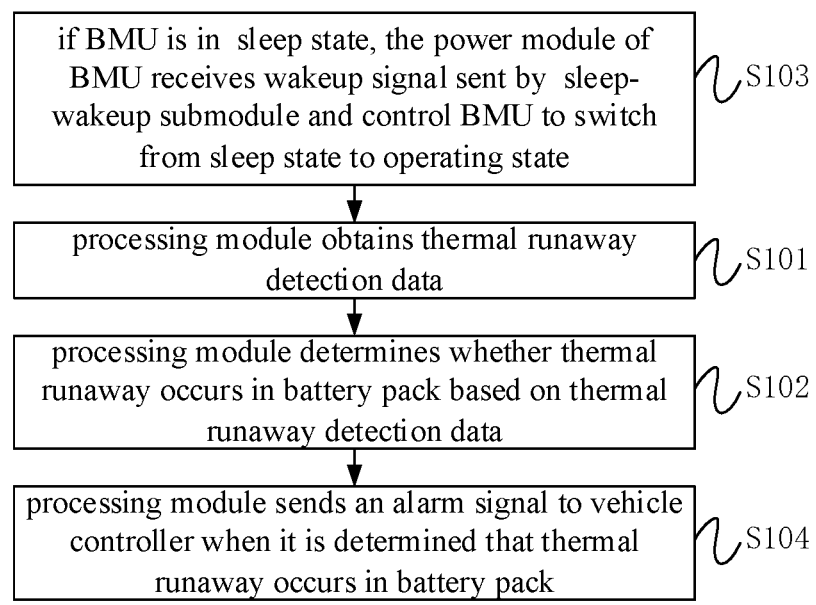
FIG. 5 is a flowchart of a method for thermal runaway detection according to another embodiment of the present disclosure.

In some examples, the detection module may further include a sleep-wakeup submodule. FIG. 5 is a flowchart of a method for thermal runaway detection according to another embodiment of the present disclosure. FIG. 5 is different from FIG. 4 in that the above method for thermal runaway detection may further include step S103 and step S104.

In step S103, if the battery management unit is in the sleep state, the power module P4 of the battery management unit may receive the wakeup signal sent by the sleep-wakeup submodule, and control the battery management unit to switch from the sleep state to the operating state.

The wakeup signal is sent when the sleep-wakeup submodule is turned on.

In step S104, the processing module may send an alarm signal to the vehicle controller when it is determined that thermal runaway occurs in the battery pack.

Details for the steps of the method for thermal runaway detection may refer to the related description in the embodiments of the thermal runaway detection circuit, which are not described herein again.

An embodiment of the present disclosure further provides a computer readable storage medium storing computer programs thereon, which, when executed by a processor(s), may implement the method for thermal runaway detection in the above embodiments.

It is to be understood that various embodiments in the specification are described in a progressive manner. The same or similar parts between the various embodiments may be referred to each other, and each embodiment focuses on a different part from other embodiments. For device embodiments, service device embodiments, and computer readable storage medium embodiments, reference may be made to the description for the method embodiments. The disclosure is not limited to the specific steps and structures described above and illustrated in the drawings. A person skilled in the art may make various changes, modifications and additions, or change the order between the steps after understanding the spirit of the disclosure. Also, a detailed description of known method techniques is omitted herein for the sake of brevity.

Those skilled in the art should understand that the above embodiments are exemplary rather than limitative. Different technical features in different embodiments may be combined to obtain beneficial effects. Other variations of the described embodiments can be understood and practiced by those skilled in the art upon studying the drawings, the specification and the claims herein. In the claims, the term "comprising" does not exclude other means or steps; the indefinite article "a" does not exclude a plurality of; the terms "first", "second" are used to illustrate names rather than to indicate any particular order. Any reference numerals in the claims should not be construed as limiting the scope of protection. The functions of the various parts in the claims may be implemented by a single hardware or software module. The presence of certain features in different dependent claims does not indicate that these technical features cannot be combined to achieve beneficial effects.

What is claimed is:

1. A thermal runaway detection circuit, comprising:
a sensing module comprising a terminating resistor, wherein the terminating resistor is connected to a temperature sensitive cable, wherein a distance between at least a portion of the temperature sensitive cable and a cell of a battery pack is less than a temperature sensitive distance threshold, and wherein the temperature sensitive cable comprises a wire A and a wire B which are in a twisted-pair structure, the wire A and the wire B are wrapped with heat-sensitive material, the heat-sensitive material is to melt when its temperature exceeds a high-temperature threshold;
a detection module comprising a first voltage dividing resistor set and a second voltage dividing resistor set, wherein the first voltage dividing resistor set comprises at least a resistor, the second voltage dividing resistor set comprises at least a resistor, and wherein the first voltage dividing resistor set is connected to the terminating resistor via the wire A and the second voltage dividing resistor set is connected to the terminating resistor via the wire B so that the first voltage dividing resistor set, the terminating resistor, and the second voltage dividing resistor set are connected in series via the temperature sensitive cable, and wherein one end of the first voltage dividing resistor set is connected to a first power supply terminal, and one end of the second voltage dividing resistor set is connected to ground; and
a processing module connected to the detection module, wherein the processing module is configured to obtain thermal runaway detection data,
wherein the thermal runaway detection data comprises first sampled data collected from a first sampling point and second sampled data collected from a second sampling point, the first sampling point is disposed between the other end of the first voltage dividing resistor set and the terminating resistor, and the second sampling point is disposed between the other end of the second voltage dividing resistor set and the terminating resistor, and wherein the processing module is further configured to:
determine an on-off state of the temperature sensitive cable based on the first sampled data and the second sampled data, the on-off state comprising a short-circuit state, an open-circuit state, or a normal-path state; and
determine whether thermal runaway occurs in the battery pack based on the on-off state of the temperature sensitive cable.

2. The thermal runaway detection circuit of claim 1, wherein at least a portion of the temperature sensitive cable is disposed right above a cell explosion-proof valve port of the cell of the battery pack.

3. The thermal runaway detection circuit of claim 1, wherein the detection module further comprises:
a sleep-wakeup submodule connected to the other end of the second voltage dividing resistor set, wherein the sleep-wakeup submodule is configured to receive a driving signal transmitted from the sensing module, and send a wakeup signal to a power module of a battery management unit when the driving signal is to control the sleep-wakeup submodule to be turned on.

4. The thermal runaway detection circuit of claim 3, wherein the sleep-wakeup submodule comprises:
a first resistor set, wherein one end of the first resistor set is connected to a second power supply terminal, and the other end of the first resistor set is connected to both of a first terminal of a first switch tube and a control terminal of a second switch tube;
the first switch tube, wherein a control terminal of the first switch tube is connected to the other end of the second voltage dividing resistor set, and a second terminal of the first switch tube is connected to the ground;
a second resistor set, wherein one end of the second resistor set is connected to a third power supply terminal, and the other end of the second resistor set is connected to a first terminal of the second switch tube;
the second switch tube, wherein a second terminal of the second switch tube is connected to both of one end of a third resistor set and the power module of the battery management unit; and
the third resistor set, wherein the other end of the third resistor set is connected to the ground.

5. The thermal runaway detection circuit of claim 1, further comprising a first protection capacitor and/or a second protection capacitor, wherein:
one end of the first protection capacitor is connected to the other end of the first voltage dividing resistor set, and the other end of the first protection capacitor is connected to the ground; and
one end of the second protection capacitor is connected to the other end of the second voltage dividing resistor set, and the other end of the second protection capacitor is connected to the ground.

6. The thermal runaway detection circuit of claim 1, further comprising:
a first filter capacitor and a first filter resistor; and/or
a second filter capacitor and a second filter resistor, wherein:
one end of the first filter capacitor is connected to the first sampling point, and the other end of the first filter capacitor is connected to the ground;
one end of the first filter resistor is connected to the other end of the first voltage dividing resistor set, and the other end of the first filter resistor is connected to the first sampling point;
one end of the second filter capacitor is connected to the second sampling point, and the other end of the second filter capacitor is connected to the ground; and
one end of the second filter resistor is connected to the other end of the second voltage dividing resistor set, and the other end of the second filter resistor is connected to the second sampling point.

7. The thermal runaway detection circuit of claim 1, wherein the processing module is configured to:
determine that the temperature sensitive cable is short circuited when the first sampled data is equal to the second sampled data; and
determine that thermal runaway occurs in the battery pack when the temperature sensitive cable is short circuited.

8. The thermal runaway detection circuit of claim 1, wherein the thermal runaway detection data further comprises battery pack parameters, and wherein the processing module is configured to:
determine that the temperature sensitive cable is open circuited, when the first sampled data is the same as data provided by the first power supply terminal and the second sampled data is the same as data provided by the ground; and
determine that thermal runaway occurs in the battery pack, when it is determined that the temperature sensitive cable is open circuited within a preset period and at least one of the battery pack parameters satisfies a fault condition.

9. The thermal runaway detection circuit of claim 8, wherein the battery pack parameters comprise one or more of:
a maximum temperature of a cell in the battery pack, a temperature change rate of a cell in the battery pack, a difference between the maximum temperature and a minimum temperature of a cell in the battery pack, a minimum voltage of a cell in the battery pack, a number of voltage sampling open-circuit faults of the battery pack, a temperature sensing failure parameter, and a cell monitoring communication failure parameter,
wherein the fault condition comprises a parameter exceeding a safety parameter threshold range or a parameter characterizing a failure.

10. The thermal runaway detection circuit of claim 1, wherein the thermal runaway detection data further comprises battery pack parameters, and wherein the processing module is configured to:
determine that the temperature sensitive cable is in a normal-path state, when the first sampled data is within a first normal data threshold range and the second sampled data is within a second normal data threshold range; and
determine that thermal runaway occurs in the battery pack, when the temperature sensitive cable is in the normal-path state and at least a set of parameters of the battery pack parameters meets a fault condition, wherein the set of parameters comprises at least two parameters.

11. The thermal runaway detection circuit of claim 10, wherein the set of parameters comprises any set of the following sets of parameters:
a minimum voltage of a cell in the battery pack, and a maximum temperature of a cell in the battery pack;

the minimum voltage of a cell in the battery pack, and a temperature change rate of a cell in the battery pack;

the minimum voltage of a cell in the battery pack, and a difference between the maximum temperature of a cell in the battery pack and a minimum temperature of a cell in the battery pack;

the temperature change rate of a cell in the battery pack, and the maximum temperature of a cell in the battery pack;

the temperature change rate of a cell in the battery pack, and the difference between the maximum temperature of a cell in the battery pack and the minimum temperature of a cell in the battery pack;

a number of voltage sampling open-circuit faults of the battery pack, and the maximum temperature of a cell in the battery pack;

the number of voltage sampling open-circuit faults of the battery pack, and the temperature change rate of a cell in the battery pack;

the number of voltage sampling open-circuit faults of the battery pack, and the difference between the maximum temperature of a cell in the battery pack and the minimum temperature of a cell in the battery pack; and the number of voltage sampling open-circuit faults of the battery pack, and a temperature sensing failure parameter, wherein the fault condition comprises a parameter exceeding a safety parameter threshold range or a parameter characterizing a failure.

12. The thermal runaway detection circuit of claim 1, wherein the thermal runaway detection data further comprises battery pack parameters, and wherein the processing module is further configured to:

determine that the temperature sensitive cable is in a normal-path state, when the first sampled data is within a first normal data threshold range and the second sampled data is within a second normal data threshold range; and send a thermal runaway warning message, when the temperature sensitive cable is in the normal-path state and the battery pack parameters satisfy a fault condition, wherein the battery pack parameters comprise a maximum voltage of a cell in the battery pack during charging, an actual state of charge of the battery pack during charging, and a charging current of the battery pack during charging; and wherein the fault condition comprises a parameter exceeding a safety parameter threshold range.

13. The thermal runaway detection circuit of claim 1, wherein the processing module is further configured to:

send an alarm signal to a vehicle controller when it is determined that thermal runaway occurs in the battery pack.

14. A method for thermal runaway detection applied in the thermal runaway detection circuit of claim 1, the method comprising:

obtaining, by the processing module, thermal runaway detection data; and determining, by the processing module, whether thermal runaway occurs in the battery pack based on the thermal runaway detection data;

wherein the thermal runaway detection data comprises first sampled data collected from a first sampling point and second sampled data collected from a second sampling point, the first sampling point is disposed between the other end of the first voltage dividing resistor set and the terminating resistor, and the second sampling point is disposed between the other end of the second voltage dividing resistor set and the terminating resistor, wherein the method further comprises:

determining an on-off state of the temperature sensitive cable based on the first sampled data and the second sampled data, the on-off state comprising a short-circuit state, an open-circuit state, or a normal-path state; and determining whether thermal runaway occurs in the battery pack based on the on-off state of the temperature sensitive cable.

* * * * *